US012701933B2

(12) United States Patent
Kerdiles et al.

(10) Patent No.: US 12,701,933 B2
(45) Date of Patent: Aug. 4, 2026

(54) METHOD FOR THE SOLID PHASE CRYSTALLISATION OF AN AMORPHOUS LAYER

(71) Applicant: COMMISSARIAT A L'ENERGIE ATOMIQUE ET AUX ENERGIES ALTERNATIVES, Paris (FR)

(72) Inventors: Sébastien Kerdiles, Grenoble Cedex (FR); Pablo Acosta Alba, Grenoble Cedex (FR); Angela Alvarez Alonso, Grenoble Cedex (FR); Mathieu Opprecht, Grenoble Cedex (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 412 days.

(21) Appl. No.: 18/470,556

(22) Filed: Sep. 20, 2023

(65) Prior Publication Data

US 2024/0096621 A1     Mar. 21, 2024

(30) Foreign Application Priority Data

Sep. 21, 2022    (FR) ..................................... 22 09570

(51) Int. Cl.
*H10P 14/20*          (2026.01)
(52) U.S. Cl.
CPC ...... *H10P 14/3816* (2026.01); *H10P 14/3806* (2026.01)

(58) Field of Classification Search
CPC ......................... H10P 14/3816; H10P 14/3806
See application file for complete search history.

(56) References Cited

U.S. PATENT DOCUMENTS

| | | | | |
|---|---|---|---|---|
| 2009/0120924 A1* | 5/2009 | Moffatt | ................. | H01L 21/268 |
| | | | | 219/385 |
| 2011/0065264 A1* | 3/2011 | Moffatt | ............. | H01L 21/02686 |
| | | | | 257/E21.133 |
| 2019/0252260 A1* | 8/2019 | Reznicek | .......... | H01L 21/02532 |

OTHER PUBLICATIONS

Preliminary French Search Report issued Jun. 12, 2023 in French Application 22 09570 filed on Sep. 21, 2022, 8 pages (with English Translation of Categories of Cited Documents & Written Opinion).

(Continued)

*Primary Examiner* — Bo B Jang

(74) *Attorney, Agent, or Firm* — Oblon, McClelland, Maier & Neustadt, L.L.P.

(57) ABSTRACT

A method for crystallising an amorphous layer included in a stack, extending directly in contact with a crystalline layer of the stack by forming an interface with the crystalline layer, and having a first face opposite the interface, and having a melting threshold $E_M$ corresponding to the energy density to be provided to the amorphous layer to achieve its melting, for a thickness Ep of the amorphous layer defined between the first face and the interface, the method including a crystallisation annealing of the amorphous layer by subjecting it, by zones, to laser pulses, and in each zone, the laser pulses are emitted by series, each laser pulse having an energy density $ED_i$ different from one series to another so as to maintain the energy density of the pulses of each series below the melting threshold.

15 Claims, 3 Drawing Sheets

(56)                    References Cited

OTHER PUBLICATIONS

Acosta Alba et al., "Solid phase recrystallization induced by multi-pulse nanosecond laser annealing", Applied Surface Science Advances 3, 2021, 5 pages.

Fenouillet-Beranger et al., "A Review of Low Temperature Process Modules Leading Up to the First (≤500° C) Planar FDSOI CMOS Devices for 3-D Sequential Integration", IEEE Transactions on Electron Devices, vol. 68, No. 7, Jul. 2021, 7 pages.

* cited by examiner

METHOD FOR THE SOLID PHASE CRYSTALLISATION OF AN AMORPHOUS LAYER

TECHNICAL FIELD

The present invention relates to the field of solid phase crystallisation of an amorphous material layer for micro-electronics or nanoelectronics, in particular in the presence of dopants to be electrically activated, in particular in order to obtain a semiconductive layer. It has, in particular, a particularly advantageous application, in the so-called "3D sequential integration" vertical integration, of electronic components.

STATE OF THE ART

To obtain doped regions in silicon, it is common to proceed with an ion implantation of dopants and to anneal the sample, so as to heal the defects generated by the implantation. This annealing favours the placement of dopants on the substitutional sites of the host crystal. The usual annealing known as RTA (Rapid Thermal Annealing) typically lasts, for silicon, from one second to a few tens of seconds at temperatures of between 800 and 1100° C. More recently, the annealing duration has been shortened to a few milliseconds, so as to limit the diffusion of dopants, in a similar temperature range.

It is also possible to voluntarily amorphise the zone to be doped via a preimplantation using relatively heavy ions, such as $Si^+$ or $Ge^+$ ions (such an ion implantation being known as PAI (Pre-Amorphising Implantation), then to proceed with the implantation of dopants in this amorphised region. The recrystallisation can thus be obtained by an annealing of a few seconds to a few minutes at temperatures of between 500 and 800° C. However, the lower the temperature is, the slower the recrystallisation is, even almost zero for a temperature less than 500° C.

A more recent approach is developed in the article by Acosta Alba et al., which appeared in *Applied Surface Science Advances*, 3 (2021), 100053, and entitled, "Solid phase recrystallisation induced by multi-pulse nanosecond laser annealing". This article shows that a laser with a pulse of duration less than 1 μs and an energy density a little below the melting threshold can be implemented to recrystalise an amorphous material layer preheated using a heating chuck and by cumulating up to 1000 shots on one same zone, to very slowly, nanometre by nanometre, arrive at a total recrystallisation of the previously amorphised layer. By this approach, the recrystallisation is made possible on a thickness of the amorphous layer less than 20 nm. However, it has been experimentally observed that even by cumulating a lot more laser shots, a total recrystallisation is not achievable by this approach when the thickness of the amorphous layer is greater, in particular, when it reaches 30 nm or more.

An aim of the present invention is therefore to propose a solution to make the known methods for the solid phase crystallisation of an amorphous layer more effective.

Another aim of the present invention is to propose a method for the solid phase crystallisation of an amorphous layer which makes it possible to make the crystallisation of an amorphous layer of a greater thickness possible which prior crystallisation techniques do not make possible, which aim to reduce the thermal budget.

Other aims, features and advantages of the present invention will appear upon examining the description below and the accompanying drawings. It is understood that other advantages can be incorporated.

SUMMARY

To achieve this aim, according to an embodiment, a method for crystallising at least one part of an amorphous layer with the basis of a first material is provided, the amorphous layer:

- a. being comprised in a stack further comprising a crystalline layer,
- b. extending directly in contact with the crystalline layer of the stack by forming an interface with the crystalline layer, and
- c. having a first face opposite the interface between the amorphous layer and the crystalline layer, and
- d. having, a melting threshold referenced $E_M$, corresponding to the energy density to be provided to the amorphous layer to achieve a melting of the first material, for a thickness Ep of the amorphous layer defined between the first face and the interface of the amorphous layer with the crystalline layer.

The method comprises a crystallisation annealing of the amorphous layer by subjecting it, by zones, to laser pulses, and is such that, in each zone, the laser pulses are emitted by series of pulses, each pulse having an energy density $ED_i$ different from one series to another, so as to maintain the energy density of the pulses of each series below the melting threshold $E_M$, the latter developing as the amorphous layer crystallises.

Thus, it is made possible to crystallise, in solid phase, fully, or as needed partially, the amorphous layer, more effectively than the current techniques make possible. Also, it is made possible to crystallise, in solid phase, fully, or as needed partially, the amorphous layer, including when the latter has an initial thickness greater than the maximum thickness hat the current techniques make possible to crystallise.

BRIEF DESCRIPTION OF THE FIGURES

The aims, objectives, as well as the features and advantages of the invention will best emerge from the detailed description of an embodiment of the latter, which is illustrated by the following accompanying drawings, wherein.

Figure 1A:
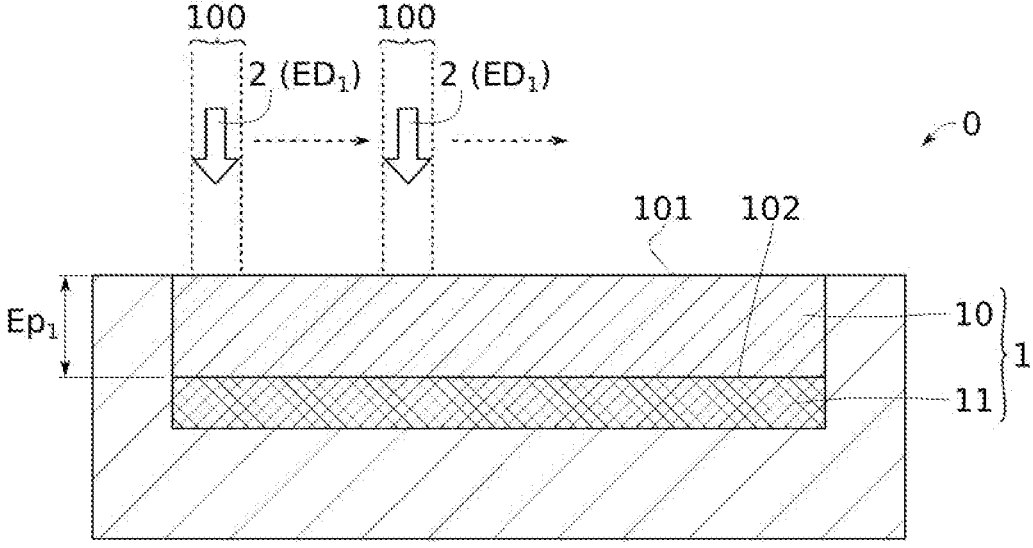
FIG. 1A represents a schematic, cross-sectional view of a micro/nanoelectronic structure on which is illustrated a first crystallisation annealing step according to an embodiment of the method of the invention.

The drawings are given as examples and are not limiting of the invention. They constitute principle schematic representations intended to facilitate the understanding of the invention and are not necessarily to the scale of practical applications. In particular, the dimensions of the different layers illustrated in FIGS. 1A, 1B, 2A and 2B are not representative of reality.

DETAILED DESCRIPTION

Before starting a detailed review of embodiments of the invention, below optional features are stated, which can optionally be used in association or alternatively.

According to an example, the energy density $ED_i$ of the pulses of each series is chosen such that $ED_i < E_M - 8\% \times E_M$ and preferably, such that $ED_i < E_M - 5\% \times E_M$, and even more preferably, such that $ED_i < E_M - 2\% \times E_M$. It is thus ensured to not exceed the melting threshold, despite the optional variations, over an amplitude of 1 to 2%, of observable laser energy density, between pulses of one same series, on most pulsed lasers.

According to an example, the energy density $ED_i$ of the pulses of each series is chosen, such that $ED_i \geq E_M - 20\% \times E_M$ and preferably such that $ED_i E_M - 15\% \times E_M$, and even more preferably, such that $ED_i \geq E_M - 10\% \times E_M$. The method thus makes it possible to dynamically adapt the laser energy density in the course of the crystallisation of the amorphous layer to maintain the energy density of the laser pulses of each series in a determined interval, for example, in the interval [EM−2%×EM, EM−10%×EM].

According to an example, the method comprises, before the crystallisation annealing of the amorphous layer, a first implantation configured to dope the amorphous layer, by implantation, in the amorphous layer, with dopants, such as As, Ga, B, P and Sb. The dose and the implantation energy of the dopants can be configured so as to define a desired doping profile in the amorphous layer. The method subsequently makes it possible to obtain a layer with the basis of the first material in its crystallised form, by having a very high dopant activation rate. According to this example, each series of pulses preferably comprises a minimum of 30 pulses.

According to an example, the method comprises, before the crystallisation annealing of the amorphous layer, a second implantation configured to form the amorphous layer, by implantation, in the amorphous layer, of so-called heavy ions, such as Si, Ge, Xe and Ar. It is thus possible to finely control the initial thickness of the amorphous layer and this thickness can be between 5 and 200 nm according to the amorphising implantation parameters, and in particular according to the dose and the implantation energy of the ions.

According to the two preceding examples, the second so-called "amorphising" implantation can be done before the first so-called "doping" implantation.

According to an example, the initial thickness of the amorphous layer can be strictly greater than 20 nm, and for example greater than or equal to 25 nm.

According to an example, at least one from among the first material and the material with the basis of which is crystalline layer is constituted can be chosen from among: Si, SiGe, Ge, SiC, GeSn and diamond.

According to an example, each series of laser pulses comprises between 1 and 1000 pulses, preferably between 5 and 50 pulses.

According to an example, the difference $\delta ED$ of energy density $ED_i$ from one series to another is between 5 and 100 $mJ/cm^2$, in particular in the case of laser pulses, the wavelength of which is located in the ultraviolet spectral domain.

According to an example, a time interval between two laser pulses in one same zone is configured, such that the stack has the time to return to a temperature substantially equal to its temperature before receiving a first of the two laser pulses.

According to an example, the time interval between two laser pulses in one same zone is, as a minimum, 1 ms, in particular in the case of laser pulses, the wavelength of which is located in the ultraviolet spectral domain.

According to an example, the laser pulses have a wavelength located in the ultraviolet spectral domain, and typically chosen from among the following values: 293 nm, 308 nm and 355 nm.

According to an example, the crystallisation annealing is continued until the complete crystallisation of the amorphous layer or alternatively, is stopped before complete crystallisation of the amorphous layer.

According to an example, a duration of each laser pulse is less than or equal to 3000 ns, preferably less than or equal to 1000 ns, and typically between 10 and 300 ns.

According to an example, the stack is comprised in a micro/nanoelectronic structure, for example of the SOI-, of the CMOS-, or of the p-n junction-type.

By a film with the basis of a material A, this means a film comprising this material A and optionally other materials.

By a parameter "substantially equal to/greater than/less than" a given value, this means that this parameter is equal to/greater than/less than the given value, plus or minus 20%, even 10%, near this value. By a parameter "substantially between" two given values, this means that this parameter is, as a minimum, equal to the lowest given value, plus or minus 20%, even 10%, near this value, and as a maximum, equal to the greatest given value, plus or minus 20%, even 10%, near this value.

According to the current crystallisation techniques, a series of shots with constant energy is made by zone of the layer to be crystallised. The present inventors have observed that this only enables a recrystallisation if the reflectivity and the thermal conductivity of the amorphous layer remain very close to those of the adjacent crystalline layer, i.e. in the case of a very low thickness of the amorphous layer, and typically less than 15 nm. In the prior art, the crystallisation is therefore:

a. not very effective, if in the course that the crystallisation progresses, the melting threshold $E_M$ moves away from the energy density applied (which is constant), b. unsuitable, if during the crystallisation, the energy density of the pulses, slightly exceeds the melting threshold $E_M$. In this case, the radiated zone melts and crystallises into a polycrystalline material, therefore with properties degraded both in volume (electrical defects, etc.) and in surface (roughness).

Moreover, it is known that, in a micro/nanoelectronic structure such as those in question, in this case, the presence of an amorphous layer modifies both the reflectivity of the surface to be crystallised with respect to the case of a perfect crystal, and the thermal conductivity of the stack. The energy density of the laser pulses necessary to reach a given temperature, for example, to reach the melting threshold $E_M$ of the amorphous layer, therefore depends on the thickness of this layer.

Furthermore, the melting threshold $E_M$ for each thickness of a determined amorphous layer, and if necessary, in each zone of this layer, can be estimated, quite roughly, by the calculation (from the optical and thermal properties of the stack of which the amorphous layer forms part) and/or measured experimentally. To experimentally measure the melting threshold for a given thickness Ep of the amorphous layer, several zones must be exposed to different laser energy densities ED so as to identify the value for which the amorphous layer crosses the melting threshold $E_M$. Among the characterisation techniques enabling this identification, the following can be cited:

a. time-resolved reflectivity, or TRR, which makes it possible to detect a sudden change in reflectivity, when the amorphous material passes into the liquid phase, b. transmission electron microscopy, or TEM, which makes it possible to observe, as a cross-section, the structure after recrystallisation, wherein the layer initially becomes polycrystalline beyond the melting threshold $E_M$, c. scatterometry or haze measurements.

Beyond the melting threshold, the layer which is initially amorphous and transformed into a polycrystalline material suddenly diffuses light very differently due to the numerous grains which compose it and to the possible roughness which has appeared on the surface if said layer is flush.

It is therefore acknowledged that a person skilled in the art knows, and will doubtlessly know, even better in the future, how to determine, for a given structure, the development of the melting threshold $E_M$ according to the thickness of the amorphous layer to be crystallised.

The method according to the invention advantageously utilises the observations stated above.

More specifically, and in reference to FIG. 1A, the method according to the invention makes it possible, from the development of the melting threshold $E_M$ according to the thickness of the amorphous layer 10 to be crystallised (such as represented graphically in each of the FIGS. 3 and 4), or according to the position of a crystallisation front of the amorphous layer 10, to define the conditions, preferably optimal, of crystallisation of this layer 10 by annealing.

Figure 2A:
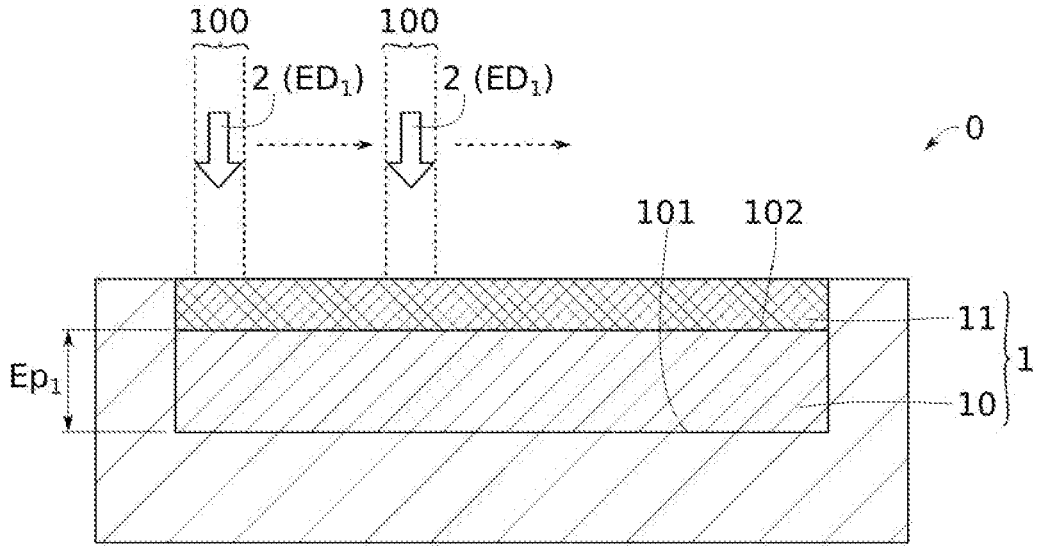
FIG. 2A represents a schematic, cross-sectional view of a micro/nanoelectronic structure other than that illustrated in FIG. 1A and in which is illustrated a first crystallisation annealing step according to an embodiment of the method of the invention.

As FIGS. 1A and 2A illustrate, the amorphous layer 10, constituted with the basis of a first material at least partially in amorphous form, is comprised in a stack 1. The stack 1 comprises at least the amorphous layer 10 and a crystalline layer 11, with the basis of a second material in crystalline form. The amorphous layer 10 extends directly in contact with the crystalline layer 11. The amorphous layer 10 can be, for example, above, below, or to the side of the crystalline layer 11 in the stack 1. The amorphous layer 10 has, more specifically:

a. an interface 102 with the crystalline layer 11, and b. a first face 101 opposite its interface 102 with the crystalline layer 11. It is the movement of the interface 102 during the implementation of the crystallisation method which materialises the progression of the crystallisation front of the amorphous layer 10.

The amorphous layer 10 thus initially has a thickness $Ep_1$ defined between its first face 101 and the interface 102.

It is to be noted here that the crystalline layer 11 is preferably of a thickness of at least 1 nm, preferably of at least 3 nm, and even more preferably of at least 5 nm; it is thus ensured that the crystalline layer 11 constitutes a growth seed specific to enabling the propagation of its crystalline nature to the amorphous layer 10. By solid phase recrystallisation, it is noted that the thermal energy enabling this recrystallisation is provided by the laser annealing.

It is also noted that at least one from among the first material and the second material can be chosen from among: Si, SiGe, Ge, SiC, GeSn and diamond. They can be identical or different from one another.

Figure 1B:
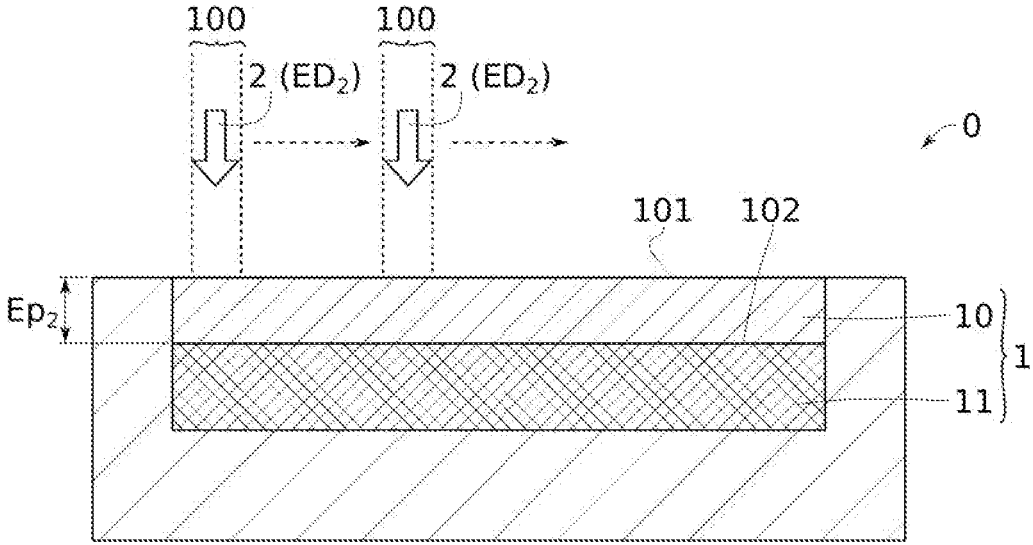
FIG. 1B represents a schematic, cross-sectional view of a micro/nanoelectronic structure obtained following the application of the first crystallisation annealing step illustrated in FIG. 1A, and in which is illustrated a second crystallisation annealing step according to an embodiment of the method of the invention.

Moreover, it is noted that, if the first face 101 and the interface 102, such as illustrated in FIGS. 1A and 1B are flat, these illustrations are not limiting of the method according to the invention, which can be implemented with a non-flat first face 101 and/or a non-flat interface 102, even, on the contrary, structured, the thickness of the amorphous layer 10 being as needed determined by zone 100.

The method comprises, as according to the current techniques, a crystallisation annealing of the amorphous layer 10 by subjecting it to laser pulses 2.

The crystallisation method proposed in this case, is distinguished from the current techniques at least in that, by zone 100, the crystallisation annealing comprises several series of laser pulses 2 at suitable energy densities in the course of the progression of the crystallisation front of the amorphous layer 10.

It is to be noted here that, relative to the example illustrated in FIG. 1A, the amorphous layer 10 can be surmounted by one or more thin dielectric layers (for example, $SiO_2$, $Si_3N_4$). Thus, the illustration of FIG. 1A, on which the first face 101 of the amorphous layer 10 is exposed is not limiting of the method according to the invention. Furthermore, and in reference to FIG. 2A, the amorphous layer 10 can be surmounted by the crystalline layer 11. The crystalline layer 11 serving as a growth seed, it can be considered that the crystallisation front is moved from the interface 102 to the first face 101 of the amorphous layer 10; this consideration does not however limit the method according to the invention.

By comparing FIGS. 1A and 2A to one another, it appears that the laser pulses 2 can be emitted to the interface 102 through the amorphous layer 10 as illustrated in FIG. 1A or through the crystalline layer 11 as illustrated in FIG. 2A. It is noted that the laser pulses 2 can also be emitted through at least one dielectric thin layer, in particular when the amorphous layer 10 is surmounted by one or more dielectric thin layers.

The method comprises, to start, the application by zone 100 of $N_1$ laser shots with an energy density $ED_1$, the energy density $ED_i$ being chosen so as to maintain the energy density of the pulses 2 of this first series below the melting threshold $E_{M1}$, and for example, in the interval $[E_{M1}-2\% \times E_{M1}, E_{M1}-20\% \times E_{M1}]$, where $E_{M1}$ is the value of the initial melting threshold (defined for the initial thickness $Ep_1$ of the amorphous layer 10). This first series, once applied in each zone 100, makes it possible to crystallise a few nanometres of the amorphous layer 10, generally from its interface 102 and in the direction of the first face 101. The first series of pulses has the effect of changing the reflectivity of the stack 1, even of the amorphous layer 10.

This crystallisation therefore moves the interface 102 between amorphous and crystalline portion of the stack 1, or equally, the crystallisation front. The thickness of the amorphous layer 10 is thus reduced by this first series of pulses. The new thickness of the amorphous layer 10 is referenced $Ep_2$ in FIGS. 1B and 2B.

Figure 2B:
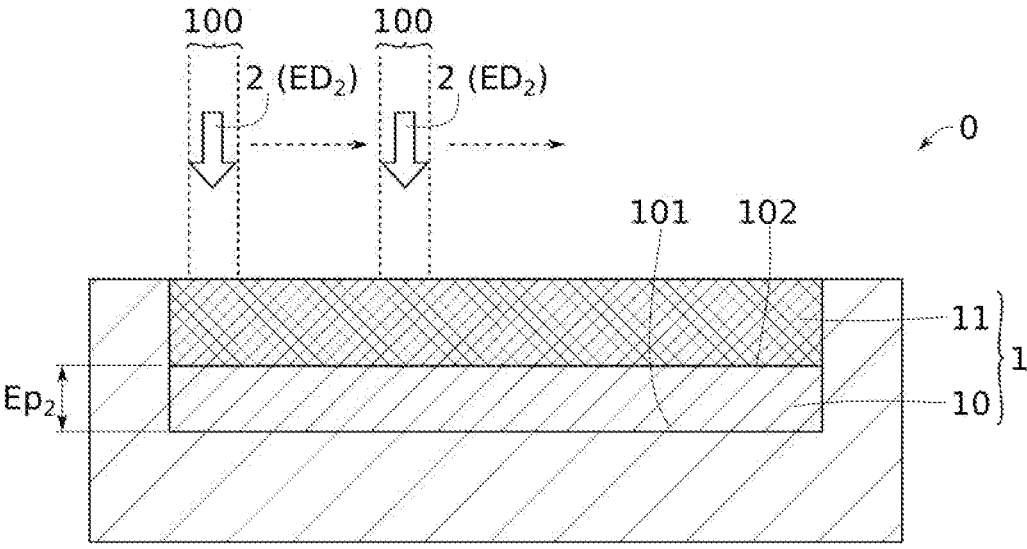
FIG. 2B represents a schematic, cross-sectional view of a micro/nanoelectronic structure obtained following the application of the first crystallisation annealing step illustrated in FIG. 2A and in which is illustrated a second crystallisation annealing step according to an embodiment of the method of the invention.

In FIG. 1B, the crystallisation front is moved upwards as the crystallisation annealing is implemented, while, in FIG. 2B, the crystallisation front will be moved downwards as the crystallisation annealing is implemented.

After the first series of pulses 2, the melting threshold becomes $E_{M2}$ because the amorphous layer 10 has a new thickness $Ep_2$ lower than the initial thickness $Ep_1$.

A second series of $N_2$ shots with an energy density $ED_2$ is thus applied so as to continue the crystallisation, $ED_2$ being chosen so as to maintain the energy density of the pulses 2 of the second series below the melting threshold $E_{M2}$, and preferably in the interval $[E_{M2}-2\%\times E_{M2}, E_{M2}-20\%\times E_{M2}]$, where $E_{M2}$ is the value of the melting threshold reached following the application of the first series of pulses 2. The melting threshold $E_{M2}$ is therefore defined for the thickness, that it remains to be crystallised, of the amorphous layer 10 after the first series of pulses 2.

Several series of pulses can thus be applied, successively and by zone 100, until optionally complete recrystallisation of the amorphous layer 10.

For each series, the number of laser shots, $N_i$, is between 1 and 1000, typically between 5 and 50.

The variation of the energy density $\delta ED$ from one series to the other is chosen, so as to maintain the energy density which is always very close to the melting threshold $E_M$ without ever exceeding it; it is typically between 10 and 100 mJ/cm$^2$ in the case of a UV laser (for example, of a wavelength substantially equal to 308 nm) with a pulse duration of 160 ns, for example, measured as the full width at half maximum (FWHM) of the pulse 2. Thus, preferably, the energy density is maintained, for each nth series, between $E_{Mn}-2\%\times E_{Mn}$ and to $E_{Mn}-20\%\times E_{Mn}$, preferably between $E_{Mn}-2\%\times E_{Mn}$ and $E_{Mn}-15\%\times E_{Mn}$, and even more preferably, between $E_{Mn}-2\%\times E_{Mn}$ and $E_{Mn}-10\%\times E_{Mn}$, so as to crystallise the amorphous layer 10 as effectively as possible, and in particular, with the least amount of laser shots possible per series.

It is noted that the time interval between two pulses 2 on one same zone 100 is preferably sufficiently high, such that the structure 0 during treatment, and in particular 1, has the time to cool before a new laser shot radiates the zone 100 again. With a UV laser (for example, of a wavelength substantially equal to 308 nm) and a pulse duration of around 50 to 200 ns, a time interval strictly greater than 1 ms suffices.

It is also noted that, the value of the melting threshold $E_M$, depends not only on the stack 1 via the materials and the thickness of the different layers, in particular, Ep, but also on the duration of the pulses 2 and therefore on the choice of the laser to perform this annealing. At a constant wavelength, the shorter the duration of the pulses 2 is, the lower the values of $E_M$ will be.

The crystallisation method such as introduced above thus provides to dynamically adapt, between series of pulses 2, the energy density ED to which the amorphous layer 10 is subjected to be annealed, so as to never exceed the melting threshold $E_M$ of the amorphous layer 10, and therefore so as to remain in the solid phase, despite the variation of the melting threshold $E_M$, in particular due to the progressive crystallisation of the amorphous layer 10, during the implementation of the method. More specifically, the energy density ED is adapted to the increase or to the decrease, in the course that the crystallisation consumes the thickness Ep of the amorphous layer 10 and therefore changes the laser energy density ED necessary to achieve the melting. It is thus made possible to fully crystallise, or as needed partially, the amorphous layer 10, including when this has an initial thickness greater than 20 nm, preferably greater than 30 or 50 nm, and which could go up to at least 200 nm. Furthermore, and as will be detailed below, the less the laser pulses 2 are required, relative to the current crystallisation techniques, in order to achieve one same crystallised thickness, which makes the method proposed in this case, a crystallisation technique which is more effective than the current crystallisation techniques.

It is noted that, in FIGS. 1A, 1B, 2A and 2B, the dotted horizontal arrows illustrate a movement of the laser from one zone 100 to another. This movement can absolutely be continuous, but it is, in practice, done by leapfrogging. It is also noted that several lasers can be used simultaneously, each pointing to a zone 100 which is specific to it. Moreover, it is noted that each pulse defines a radiated zone 100, such that the interface 102 can be "cut" into a plurality of zones 100; the latter overlapping one another, or not.

Figure 3:
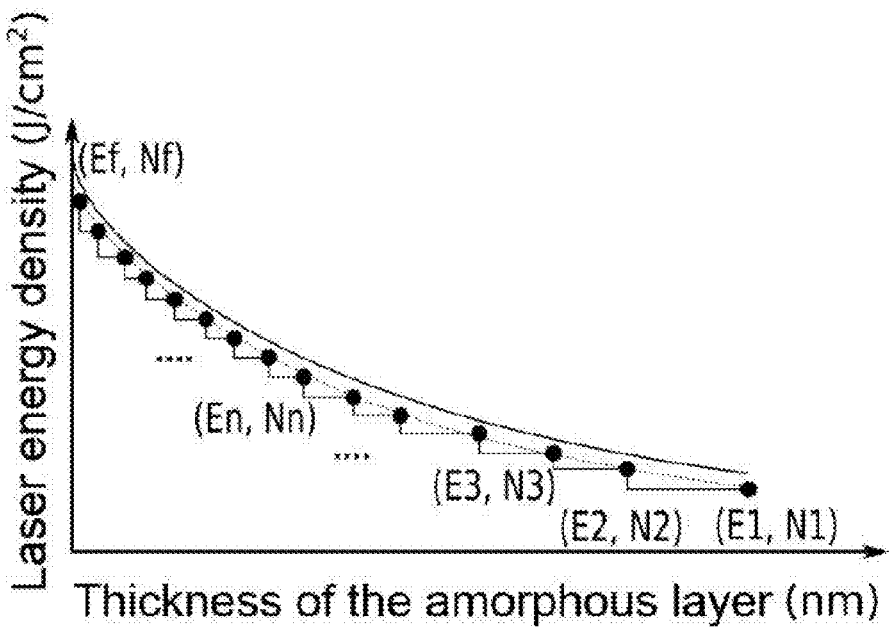
FIG. 3 is a graphic illustration of a first embodiment of the method according to the invention and consisting of several series of $N_i$ laser shots with a laser energy density ED, where i indicates the number of the series of pulses; in this example, it is chosen to maintain the energy density at around 5% below the melting threshold all throughout the recrystallisation.
Figure 4:
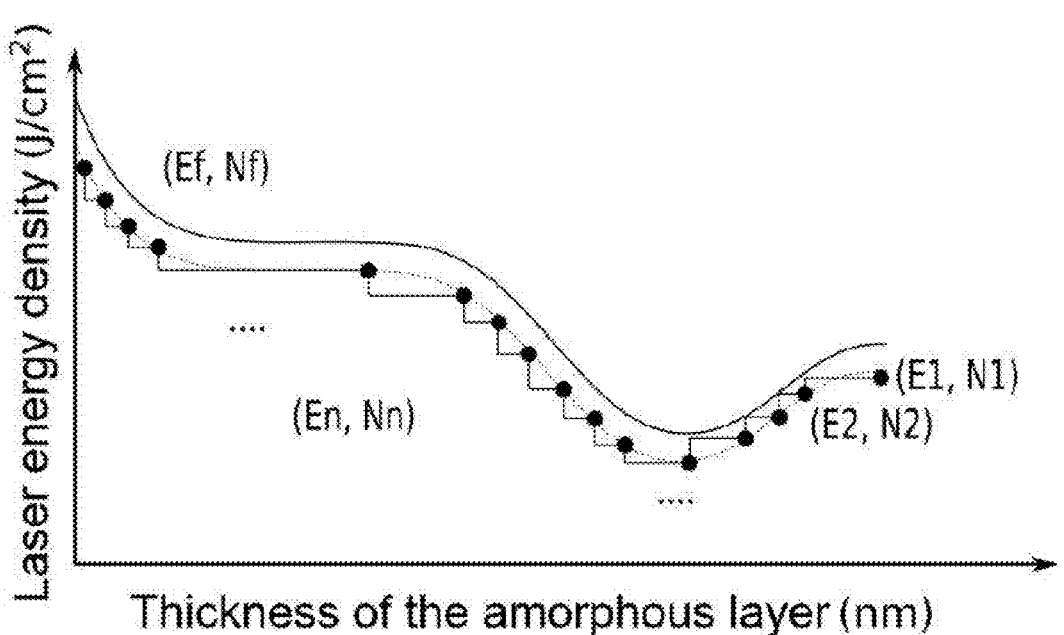
FIG. 4 is a graphic illustration of a second embodiment of the method according to the invention and consisting of several series of Nn laser shots with a laser energy density ED, where n indicates the number of series of pulses; in this example, it is chosen to maintain the energy density at around 8% below the melting threshold.

FIGS. 3 and 4 each illustrate a dynamic adaptation resulting from the implementation of the method according to the invention. The solid curve represents here the development of the melting threshold $E_M$ according to the thickness Ep of the amorphous layer 10. The dotted curve of FIG. 3 has been obtained by subtracting, at the solid curve, 5% of its value at the y-axis. The dotted curve of FIG. 4 has been obtained by subtracting, at the solid curve, 8% of its value at the y-axis.

FIG. 2 illustrates the dynamic adaptation which results from the implementation of the method according to the invention in the case of a monotonous development of the melting threshold $E_M$ according to the thickness Ep of the amorphous layer 10. Here, it is observed that the energy density of the pulses 2 actually varies by steps, in this case, by increasing as the thickness Ep of the amorphous layer 10 decreases.

The implementation of the method according to the invention is not, for all that, limited to a monotonous development of the melting threshold $E_M$ according to the thickness Ep of the amorphous layer 10. For example, the method according to the invention can be implemented when the development of the melting threshold $E_M$ according to the thickness of the amorphous layer 10 varies in the way illustrated in FIG. 4, by having an inflection point and/or a local minimum. The implementation of the method also extends to a development of the melting threshold $E_M$ according to the thickness of the amorphous layer 10 which would have a local maximum or which would not be monotonous.

One of the aims of the crystallisation made possible by the implementation of the method according to the invention consists of activating dopants comprised in the amorphous layer 10, so as to be able to utilise its semiconductive properties, once the amorphous layer 10 is at least partially crystallised.

In order to achieve this aim, the method can comprise, before the crystallisation annealing of the amorphous layer 10, a first implantation configured to dope the amorphous layer 10, by implantation, at least in the part to be crystallised of the layer 10, of dopants. Such dopants can, for example, be at least one chosen from among: As, Ga, B, P and Sb.

The dose and the implantation energy of the dopants can be configured so as to define a doping profile desired in the amorphous layer 10. The method according to the invention subsequently makes it possible to obtain a layer with the basis of the first material in its crystallised form, by having a very high dopant activation rate.

The method can further comprise, before the crystallisation annealing of the amorphous layer 10, and preferably before the dopant implantation step in the amorphous layer 10, a second implantation configured to amorphise the first material, intended to form the amorphous layer 10. This second implantation step can more specifically consist of the implantation of so-called heavy ions (the atomic mass of which is greater than or equal to that of Si), such as at least one chosen from among: Si, Ge, Xe and Ar.

It is thus possible to finely control the initial thickness $Ep_1$ of the amorphous layer 10 and this initial thickness $Ep_1$ can be between 5 and 200 nm according to the parameters of the amorphising implantation, and in particular, according to the dose and the implantation energy of the ions.

Alternatively, the amorphisation could be due to the performing of a plasma etching of a surface layer. Such etchings are indeed known to have "the disadvantage" of amorphising the underlying material, and in particular, silicon, typically over a thickness which could reach 15 nm.

The amorphising implantation is optional, in particular in the case where the dose and the implantation energy of the dopants would lead to an amorphisation of the implanted dopant zone. For example, the ion implantation of certain dopants, like phosphorus or arsenic (among others) also makes it possible to make the implanted zone amorphous, without needing to proceed with an amorphising heavy ion implantation.

The amorphous layer 10 can therefore have been voluntarily made amorphous, by amorphisation; thus, "amorphous layer" or "amorphised layer" are equally referred to, and "recrystallisation" can thus be referred to, rather than "crystallisation".

Furthermore, it is noted that the two implantations, that leading to the amorphisation and that introducing the dopants, can be broken down into several implantations. For example, the amorphising implantation can consist of a combination of implantations with one or more ions, with one or more different energies. The implantation of dopants can itself also consist of a combination of implantations of one or more dopants, with optionally several different energies so as to introduce a first dopant more deeply than a second; for example, it is possible to implant boron B in SiGe, as the first material intended to constitute the amorphous layer 10, at a depth of between 0 and 40 nm, then gallium Ga in this same SiGe at a depth of between 0 and 10 nm.

Another variant could consist of stopping the crystallisation at a desired thickness/depth. For example, in the case of a pre-amorphised region over a thickness substantially equal to 50 nm, it can be decided to stop the crystallisation at 10 nm from the first face 101 of the amorphous layer 10 so as to preserve an amorphous layer of 10 nm, which can be useful, for example, for the formation of contact by silicidation. The crystallisation by annealing according to the invention therefore also makes it possible to crystallise the amorphous layer 10 over a controlled thickness, more easily than a conventional annealing by RTA or more generally by RTP (Rapid Thermal Processing) makes possible.

The stack 1 can be comprised in a microelectronic or nanoelectronic structure 0. Among the micro/nanoelectronic structures in question in this case, those so-called SOI-type can be cited, wherein at least some of the amorphous layer 10 would be intended to form a semiconductive layer, or those so-called CMOS (Complementary metal-oxide-semiconductor)-type, or also those so-called p-n junction, i.e. at least two layers with dopants of opposite p and n types.

Moreover, it must be noted that the method according to the invention is a particularly relevant implementation in the case of a structure 0 which could not be annealed by RTP, without being disadvantageously impacted, in particular due to the presence of microelectronic or nanoelectronic components, for example buried, sensitive to high temperatures, and typically to temperatures greater than 400° C. The implementation of the crystallisation method according to the invention, in particular by using a laser in ultraviolet, makes it possible to only heat the part of the structure 0 which is to be crystallised and to maintain the rest of the structure 0 below a moderate and acceptable temperature, beyond which the properties of the structure 0 could be altered. It is thus possible to crystallise an optionally thick amorphous layer 10 and to activate its dopants, by only heating the latter and not heating significantly, even not at all, the rest of the structure 0. It is thus understood that the method according to the invention is particularly suitable for a 3D sequential integration application (for example, of the type: CoolCube™ (see, for example, IEEE Trans. Electr. Dev. Vol. 68 No. 7 p. 3142 (2021)), cold CMOS, etc.).

As an illustration, and in a not-at-all limiting way, below are provided, in the form of a table, examples of implementations of the method according to the invention.

In all these examples, the crystallisation annealing is done using an XeCl laser of wavelength 308 nm and of pulse duration 160 ns (FWHM). The energy density applied by each pulse 2, expressed in $J/cm^2$, depends directly on the type of laser. The implementation of another laser, i.e. with a different wavelength radiation and/or with a different pulse duration, would require to adapt the energy density to lead to a similar crystallisation.

A first series of examples relates to pre-amorphised Si samples over a thickness of 30 nm by Ge implantation at a dose of $1 \times 10^{15}$ ions/cm$^2$ with an implantation energy substantially equal to 5 keV, and doped using boron at a dose of $1 \times 10^{15}$ ions/cm$^2$ with an implantation energy substantially equal to 2 keV.

In this configuration and with the abovementioned laser, the melting of the amorphised layer 10 can be observed for energy densities greater than or equal to 1.20 $J/cm^2$. For comparison, the melting of an equivalent, but non-amorphised sample occurs from 1.70 $J/cm^2$. The solid phase crystallisation of the amorphised layer can therefore be initiated at an energy density less than 1.20 $J/cm^2$.

For comparison, recrystallisation tests have been carried out at a constant energy density by applying the technique, prior to the present invention, which is described in the abovementioned article by Acosta Alba et al. Thus, up to 1000 laser shots per zone 100 with each from among an energy density of 1.15 and an energy density of 1.10 $J/cm^2$ have been applied to the amorphised layer 10. It has been observed that the recrystallisation is only partial under these conditions. This illustrates that, in this case, the crystallisation techniques prior to the invention do not make it possible, at the very least effectively, to achieve the desired result.

On the same type of samples, several embodiments of the method according to the invention however have made it possible to crystallise all of the layer initially amorphised 10. These methods are characterised by:

a. An initial energy density, EDi, necessarily below the value leading to the melting at the start of treatment, in this case, below 1.20 J/cm²;

b. A final energy density, EDf, necessarily below the value leading to the melting in the case of a non-amorphised sample, in this case, below 1.70 J/cm²;

c. An increment in energy density, δED, which could, for example be defined as a fraction of the difference between the value of the final energy density and the final energy density value, so as to define, in proportion, the number of series of pulses 2 to be made; and d. The number N of shots per zone 100, per series of pulses 2.

The table below illustrated a first series of examples of implementations of the method according to the invention having led to a complete recrystallisation (total number of shots in bold) or having failed (total number of shots in italic), and makes it possible to compare the results of these implementations with an example of an implementation of the constant energy density technique, which is described in the abovementioned article by Acosta Alba et al. (in the second line of the table):

TABLE

| EDi (J/cm²) | EDi (J/cm²) | δED (J/cm²) | N | Total number of shots |
|---|---|---|---|---|
| 1.10 | 1.10 | 0 (state of the art: constant ED) | 1000 | 1000 |
| 1.10 | 1.60 | 0.025 | 1 | *21* |
| | | | 5 | 105 |
| | | | 10 | 210 |
| | | | 30 | 630 |
| | | | 100 | 2100 |
| | | 0.050 | 1 | *11* |
| | | | 5 | 55 |
| | | | 10 | 110 |
| | | | 30 | 330 |
| | | | 100 | 1100 |
| | | 0.100 | 1 | *6* |
| | | | 5 | *30* |
| | | | 10 | *60* |
| | | | 30 | 180 |
| | | | 100 | 600 |

It is first noted that the implementation of the constant energy density technique (second line of the table) does not make it possible, even after 1000 shots, to fully crystallise the amorphous layer which, in the given example, has a thickness of 30 nm, greater than the maximum thickness of 20 nm studied in the abovementioned article by Acosta Alba et al.

It is observed that, which was impossible according to the state of the art (with constant energy density), even after 1000 shots, becomes possible while gradually increasing the energy density to be adapted to the development of the crystallisation front. Several combinations are even possible according to the choice of the increment of energy density δED and the number N of shots by energy intermediate level.

Furthermore, the total number of shots enabling the complete crystallisation can be optimised according to the aim sought. It can be sought to crystallise with a minimum number of shots. In this case, 55 shots suffice by choosing an increment δED of 50 mJ/cm² and N=5 shots per energy density level.

It is also possible to seek other features, like a better activation of dopants. It has thus been observed that it is preferable to opt for implementations of the method according to the invention with at least N=30 shots per energy density level.

A possible improvement of these examples of implementations of the method according to the invention consists of performing the crystallisation annealing, while the sample is preheated, for example using a heating chuck. In the case of a stack 1, and more specifically an amorphous layer 10, Si- or SiGe-based, this assistance can be adjusted between 25 and 450° C., typically. This makes it possible to further reduce the number of shots per energy density level necessary for achieving the result sought, possibly achieving a complete crystallisation. It is noted that the examples searched in the table above have been obtained by implementations of the method, in the absence of such a preheating.

The examples of implementations for which the crystallisation is not satisfactory (cases marked by a total number of shots in italic in the table above) correspond to combinations with too few shots per energy density level. The energy density development is thus too rapid with respect to the progression of the recrystallisation front. During the treatment, the laser energy density thus exceeds the melting threshold $E_M$ and generates the melting of the remainder of the amorphous layer 10, then its so-called "explosive" poly-Si solidification, which is not desired from an electrical standpoint.

A second series of examples relates to SiGe samples with 20% of Ge, pre-amorphised over a thickness of 30 nm by Ge implantation at a dose of $1 \times 10^{15}$ ions/cm² with an implantation energy substantially equal to 5 keV, and doped by implantation of boron at a dose of $1 \times 10^{15}$ ions/cm² with an implantation energy substantially equal to 2 keV.

In this configuration, and always with an XeCl laser, the melting of the amorphised layer 10 can be observed for an energy density greater than or equal to 1.05 J/cm². For comparison, the melting of an equivalent but non-amorphised sample occurs from 1.40 J/cm². The solid phase recrystallisation of the amorphised layer 10 can therefore be initiated at an energy density less than 1.05 J/cm².

Recrystallisation tests have been carried out at constant energy density by applying up to 1000 laser shots on one same zone 100 at 1.00 or 0.95 J/cm². The recrystallisation is only partial under these conditions. This illustrates that, in this case, a constant energy density method according to the prior art does not make it possible to achieved the desired result.

In the same configuration, and always with the abovementioned laser, examples of implementations of the method according to the invention have made it possible to return to an SiGe monocrystalline layer with the following conditions:

a. An initial energy density, $ED_i$, equal to 0.85 J/cm², b. A final energy density, $ED_f$, equal to 1.25 J/cm², c. An increment in energy density, $δED_i$ equal to 25 or 50 or 100 mJ/cm², d. A number N of shots on one same zone 100, for one same energy density, equal to 30 or 100.

In the case where 30 shots are made for each energy density level, the complete recrystallisation is, in this case, obtained using 510 shots, to be compared with the 1000 shots at constant energy which do not enable a correct crystallisation.

The invention is not limited to the embodiments described above.

For example, the results given above have been obtained at a constant number of shots per energy density level; it is, however, also possible to play on a variation of this number of shots per energy density level, so as to also optimise the adaptation of the annealing to the development of the crystallisation front.

For example, the results given above have been obtained at an increment in energy to density, $\delta ED_i$ constant between each series; it is, however, also possible to play on a variation of this increment from one series to another, so as to also optimise the adaptation of the annealing to the development of the crystallisation front.

For example, the results given above have been obtained at a constant pulse duration; it is, however, also possible to play on a variation, for example, from one series to another, of this pulse duration, on which the energy density of the pulses depends, so as to also optimise the adaptation of the annealing to the development of the crystallisation front.

For example, if the examples given above relate to the case of laser pulses 2, the wavelength of which is located in the ultraviolet spectral domain (for example, at 293 nm, 308 nm or 355 nm), it is not excluded that the wavelength of the pulses can be chosen as being located in the blue, in the green (for example, at 532 nm), even in the red (for example, at 633 or 850 nm).

For example, if the use of a laser in the solid state seems to be favoured, those with gas lasers cannot be excluded. The latter can have the advantage of making it possible to change the pulse duration 2, which can constitute an additional optimisation parameter. However, it remains simpler to make the number of shots vary per energy density level and/or the energy density of the shots by changing laser.

The invention claimed is:

1. A method for crystallizing at least a portion of an amorphous layer based on a first material, the amorphous layer being included in a stack that further comprises a crystalline layer, the amorphous layer extending in direct contact with the crystalline layer so as to define an interface with the crystalline layer, the amorphous layer having a first face opposite the interface, and the amorphous layer having a melting threshold energy density $E_M$ corresponding to an energy density required to melt the first material for a thickness Ep of the amorphous layer defined between the first face and the interface, the method comprising:

performing a crystallization annealing of the amorphous layer by subjecting the amorphous layer, zone by zone to laser pulses, wherein, in each zone, the laser pulses are emitted in a plurality of series of pulses, each series having pulse energy density $ED_i$, the pulse energy density $ED_i$ differing from one series to another, and wherein, for each of the series, the pulse energy density $ED_i$ is maintained below the melting threshold energy density $E_M$, the melting threshold energy density $E_M$ evolving as the amorphous layer crystallizes.

2. The method according to claim 1, wherein the pulse energy density $ED_i$ of each of the series satisfies: $ED_i < E_M - 8\% \times E_M$.

3. The method according to claim 1, wherein the pulse energy density $ED_i$ of each of the series satisfies: $ED_i \geq E_M - 20\% \times E_M$.

4. The method according to claim 1, further comprising, prior to the crystallization annealing, performing a first implantation configured to dope the amorphous layer by implanting dopants into the amorphous layer.

5. The method according to claim 4, further comprising, prior to the crystallization annealing, performing a second implantation configured to form the amorphous layer by implanting heavy ions into the amorphous layer.

6. The method according to claim 5, wherein the second implantation is performed before the first implantation for doping the amorphous layer.

7. The method according to claim 1, wherein an initial thickness of the amorphous layer is greater than 20 nm.

8. The method according to claim 1, wherein at least one of the first material and a material forming the crystalline layer is selected from a group including Si, SiGe, Ge, SiC, GeSn and diamond.

9. The method according to claim 1, wherein each of the series of laser pulses comprises between 1 and 1000 laser pulses.

10. The method according to claim 1, wherein a difference $\delta ED$ in pulse energy density $ED_i$ between successive series is between 5 mJ/cm$^2$ and 100 mJ/cm$^2$.

11. The method according to claim 1, wherein a time interval between two successive laser pulses applied to a same zone is selected such that the stack substantially returns to a temperature present before receipt of a first of the two successive laser pulses.

12. The method according to claim 1, wherein a time interval between two successive laser pulses applied to a same zone is at least 1 ms.

13. The method according to claim 1, wherein the laser pulses have a wavelength located in a ultraviolet spectral domain, the wavelength being selected from a group including 293 nm, 308 nm, and 355 nm.

14. The method according to claim 1, wherein a duration of each of the laser pulses is less than or equal to 3000 ns.

15. The method according to claim 1, wherein the stack is included in a microelectronic or nanoelectronic structure.

* * * * *